(12) United States Patent
Chang et al.

(10) Patent No.: US 11,676,983 B2
(45) Date of Patent: Jun. 13, 2023

(54) SENSOR WITH DAM STRUCTURE AND METHOD FOR MANUFACTURING THE SAME

(71) Applicant: Powertech Technology Inc., Hsinchu County (TW)

(72) Inventors: Chung-Chang Chang, Hsinchu County (TW); Chang-Lun Lu, Hsinchu County (TW); Ming-Hung Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 18 days.

(21) Appl. No.: 17/134,543

(22) Filed: Dec. 28, 2020

(65) Prior Publication Data

US 2021/0210539 A1 Jul. 8, 2021

Related U.S. Application Data

(60) Provisional application No. 62/957,799, filed on Jan. 7, 2020.

(30) Foreign Application Priority Data

Dec. 7, 2020 (TW) ................................. 109142999

(51) Int. Cl.
*H01L 27/146* (2006.01)

(52) U.S. Cl.
CPC .. *H01L 27/14632* (2013.01); *H01L 27/14618* (2013.01); *H01L 27/14687* (2013.01)

(58) Field of Classification Search
CPC ................................................. H01L 27/14618
See application file for complete search history.

(56) References Cited

U.S. PATENT DOCUMENTS

| 2013/0241022 A1* | 9/2013 | Oka ................ H01L 27/14634 257/443 |
| 2016/0247849 A1* | 8/2016 | Oganesian ........ H01L 27/14618 |

FOREIGN PATENT DOCUMENTS

| TW | 201826514 | 7/2018 |
| TW | 201904038 | 1/2019 |
| TW | 201935673 | 9/2019 |

OTHER PUBLICATIONS

"Office Action of Taiwan Counterpart Application", dated Mar. 16, 2021, p. 1-p. 4.

* cited by examiner

*Primary Examiner* — Suberr L Chi
(74) *Attorney, Agent, or Firm* — JCIPRNET

(57) ABSTRACT

A sensor includes a first chip, a dam structure and a cover. The first chip includes a substrate, a sensing area and a low-k material layer. The sensing area is located on the surface of the substrate. The low-k material layer is located in the substrate. The dam structure is located on the first chip. The dam structure covers the edge of the low-k material layer. The cover is located on the dam structure and covers the sensing area. A manufacturing method of a sensor is also provided.

8 Claims, 18 Drawing Sheets

SENSOR WITH DAM STRUCTURE AND METHOD FOR MANUFACTURING THE SAME

CROSS-REFERENCE TO RELATED APPLICATION

This application claims the priority benefit of U.S. Provisional Application No. 62/957,799, filed on Jan. 7, 2020, and Taiwan Application No. 109142999, filed on Dec. 7, 2020. The entirety of each of the above-mentioned patent applications is hereby incorporated by reference herein and made a part of this specification.

BACKGROUND

Technical Field

The disclosure relates to an integrated circuit and a method for manufacturing the same, and in particular to a sensor and a method for manufacturing the same.

Description of Related Art

In general, in the manufacturing technology of integrated circuits with sensors, circuits with narrower line widths, low-k materials, and other methods have continued to be used to miniaturize sensors and provide faster operating speeds. However, the above technology has many problems to be solved. For example, because low-k materials are prone to cracking during transportation or manufacturing, the reliability of the sensors may be reduced or the sensors may even be completely damaged. Therefore, it is a challenge for the people skilled in the art to improve the cracking of low-k materials during the transportation or manufacturing process, so as to improve the reliability and yield of the sensors.

SUMMARY

The disclosure provides a sensor and a manufacturing method thereof, which may improve the cracking of low-k materials during transportation or manufacturing, thereby improving the reliability and yield of the sensor.

A sensor of the disclosure includes a first chip, a dam structure, and a cover. The first chip includes a substrate, a sensing area, and a low-k material layer. The sensing area is located on a surface of the substrate. The low-k material layer is located in the substrate. A dam structure is located on the first chip. The dam structure covers an edge of the low-k material layer. The cover is located on the dam structure and covers the sensing area.

The manufacturing method of a sensor of the disclosure includes at least the following steps. A first wafer is provided, where the first wafer includes a substrate, a sensing area, and a low-k material layer; the sensing area is located on a surface of the substrate, and the low-k material layer is located in the substrate. Multiple grooves are formed on the substrate, where the multiple grooves surround the sensing area and the low-k material layer. A dam structure is formed on the first wafer, and part of the dam structure is located in the multiple grooves to cover an edge of the low-k material layer. A cover is disposed on the dam structure such that the cover covers the sensing area. The first wafer is cut to form multiple sensors.

Based on the above, in the disclosure, through the design of the grooves, part of the dam structure may be located in the groove so as to cover the edge of the low-k material layer to form an edge protection structure of the low-k material layer. Therefore, the cracking of the low-k material layer during transportation or manufacturing can be improved, and the reliability and yield of the sensor can be increased. Furthermore, since the grooves are formed using existing manufacturing processes, the reliability and yield of the sensors are improved without incurring additional manufacturing costs.

In order to make the above-mentioned features and advantages of the disclosure more obvious and understandable, the embodiments are specifically described below in conjunction with the accompanying drawings for detailed description as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
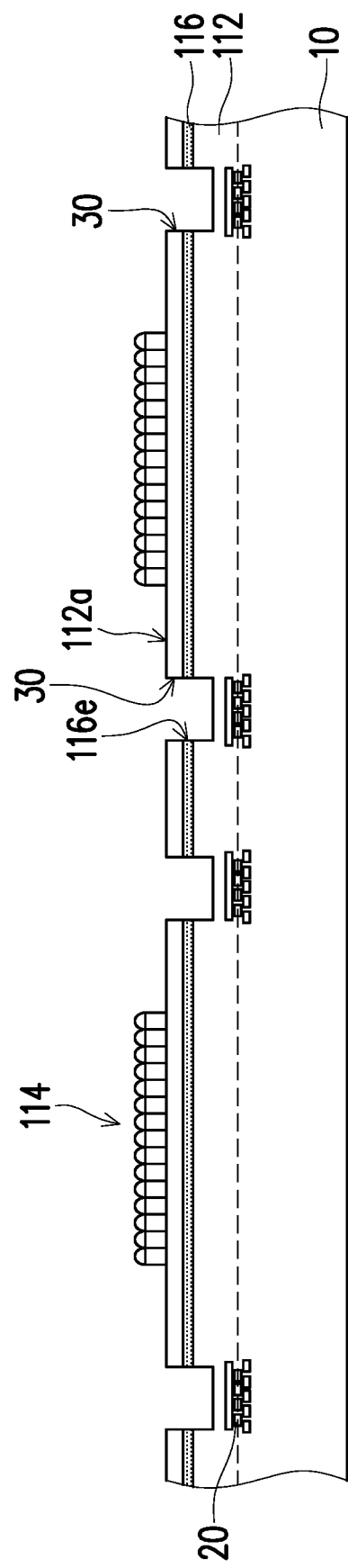
FIG. 1A to FIG. 1F are schematic partial cross-sectional diagrams of a manufacturing method of a sensor according to an embodiment of the disclosure.
Figure 1B:
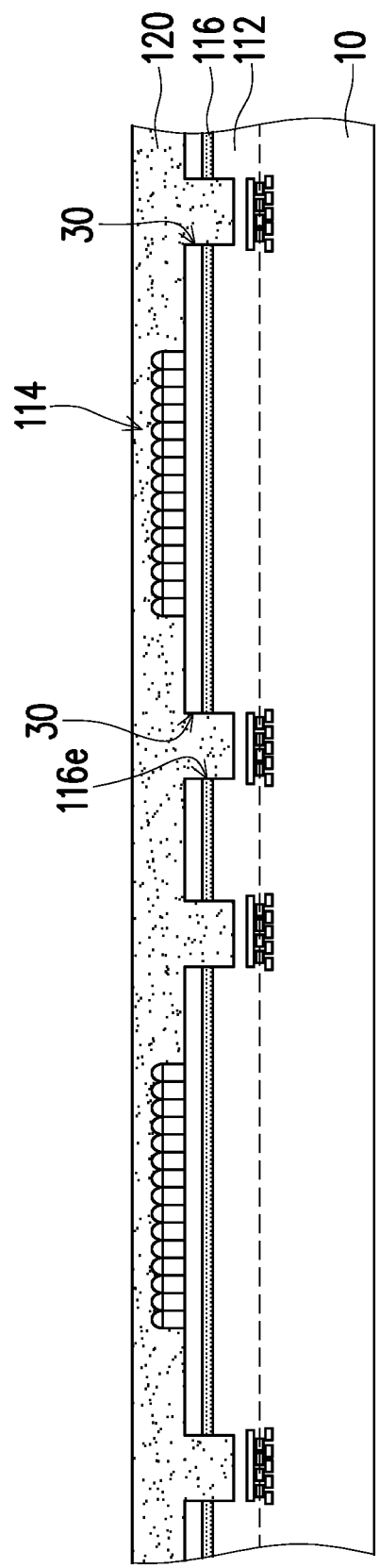

Reference will now be made in detail to the exemplary embodiments of the disclosure, examples of which are illustrated in the accompanying drawings. Wherever possible, the same reference numbers are used in the drawings and the description to refer to the same or like parts.

Directional terms used herein (for example, up, down, right, left, front, back, top, bottom) are only used as a reference to the drawings and are not intended to imply absolute orientation.

Unless explicitly stated otherwise, any method described herein is in no way intended to be interpreted as requiring the steps to be performed in a specific order.

The disclosure will be explained more fully with reference to the drawings of the present embodiment. However, the disclosure may also be embodied in various forms, and should not be limited to the embodiments described herein. The thickness or sizes of the layers or areas in the drawings are exaggerated for clarity. Identical or similar reference numerals indicate identical or similar devices and will not be repeated in the following paragraphs.

FIG. 1A to FIG. 1F are schematic partial cross-sectional diagrams of a part of a manufacturing method of a sensor according to an embodiment of the disclosure. FIG. 2A to FIG. 2P are schematic cross-sectional diagrams of other grooves of different configurations of the disclosure.

Figure 2A:
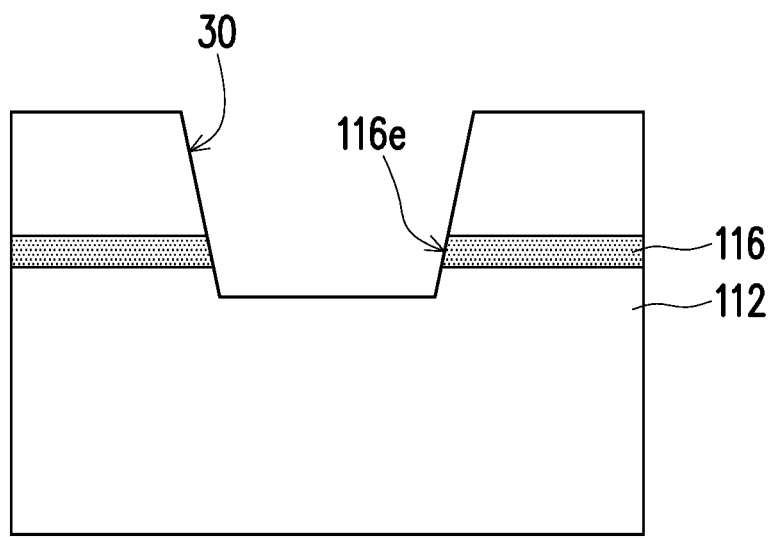
FIG. 2A to FIG. 2P are schematic cross-sectional diagrams of other grooves of different configurations of the disclosure.

Referring to FIG. 1A, in the present embodiment, a manufacturing process of a sensor 100 may include the following steps. First, a first wafer 110 is provided. The first wafer 110 may include a substrate 112, a sensing area 114 and, a low-k material layer 116. The sensing area 114 may be located on a surface 112a of the substrate 112, and the low-k material layer 116 may be located in the substrate 112.

In other words, the low-k material layer 116 is not a dielectric layer in a redistribution dielectric line (RDL), but the disclosure is not limited thereto.

In the present embodiment, as shown in FIG. 1A, the sensing area 114 may be, for example, an image sensing area, so the first wafer 110 may be a CMOS image sensor (CIS) wafer. However, the disclosure does not limit the type of the sensing area 114. The type of the sensing area 114 may be adjusted according to actual design requirements; as long as the sensing area 114 has a sensing function, it belongs to the protection scope of the disclosure.

In some embodiments, the dielectric material of the low-k material layer 116 may be, for example, fluorinated silicate glass (PSG), boron-phosphorosilicate glass (BPSG), fluorosilicate glass (FSG), SiOxCy, spin-coated glass, spin-coating polymers, silicon carbide materials, the aforementioned compounds, the aforementioned composites, the aforementioned combinations, or the like, but the disclosure is not limited thereto.

It should be noted that although FIG. 1A schematically illustrates that the first wafer 110 includes two sensing area 114, the number of sensing area 114 on the first wafer 110 is not limited in the disclosure, and may be determined according to the actual size of the first wafer 110. Further, although the low-k material layer 116 is schematically shown in FIG. 1A as being close to the surface 112a of the substrate 112, the position of the low-k material layer 116 in the substrate 112 is not limited in the disclosure, and may be adjusted according to the actual design requirements of the low-k material layer 116 in the first wafer 110.

In some embodiments, before the first wafer 110 is provided, bonding a second wafer 10 on a side of the first wafer 110 opposite to the sensing area 114 may be included, where a bonding layer 20 may be provided between the first wafer 110 and the second wafer 10. Here, the first wafer 110 and the second wafer 10 may be bonded by any suitable wafer to wafer bonding method, and a position of the bonding layer 20 in FIG. 1A is schematically shown. The position of the bonding layer 20 may also be extended and distributed between the first wafer 110 and the second wafer 10. In other words, the bonding layer 20 may be entirely formed between the first wafer 110 and the second wafer 10, where the first wafer 110 and the second wafer 10 are separated by, for example, a dotted line extending through the bonding layer 20 in FIG. 1A.

In some embodiments, when the first wafer 110 is an image sensing wafer, the second wafer 10 may be a logic wafer. Therefore, with such wafer process integration, an optical lens of the image sensor may have a faster frequency, thereby improving the operating performance of electronic products. However, the disclosure is not limited thereto. Both the first wafer 110 and the second wafer 10 may be bonded with wafers with required functions according to actual design requirements, and the second wafer 10 may also further bonded with other functional wafers. That is, the disclosure applies not only to the bonding between two wafers, but also to the bonding between multiple wafers.

Please continue to refer to FIG. 1A. Multiple grooves 30 may be formed on the substrate 112, where the multiple grooves 30 surround the sensing area 114 and the low-k material layer 116. The grooves 30 may expose an edge 116e of the low-k material layer 116, such that an edge protection structure on the edge 116e of the low-k material layer 116 may be effectively formed in a subsequent dam structure 120 located in the grooves 30.

In some embodiments, the groove 30 may be formed by removing part of the substrate 112 by, for example, a laser process or a blade process, where the part of the substrate 112 that is removed includes part of the low-k material layer 116. However, the disclosure is not limited thereto. In other embodiments, the groove 30 may be formed by other suitable processes.

Figure 2B:
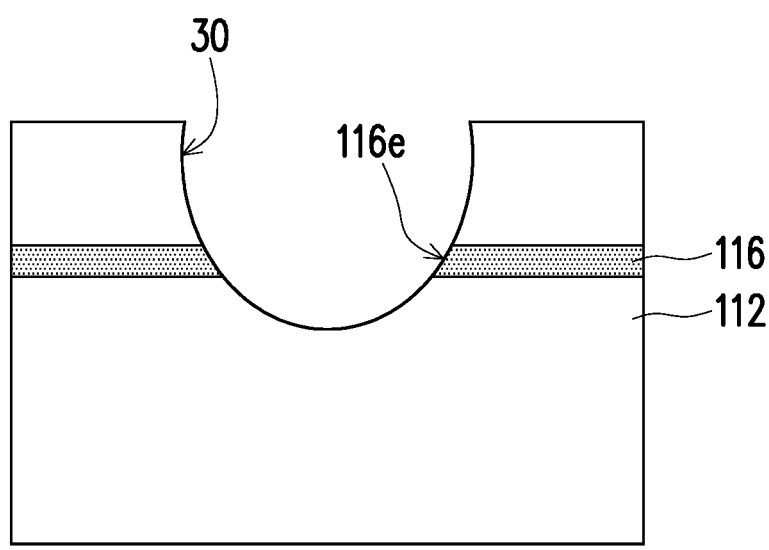
Figure 2C:
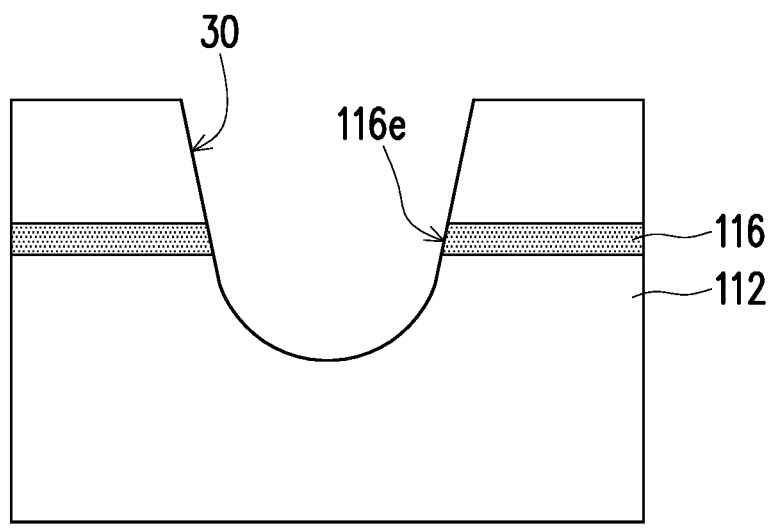
Figure 2D:
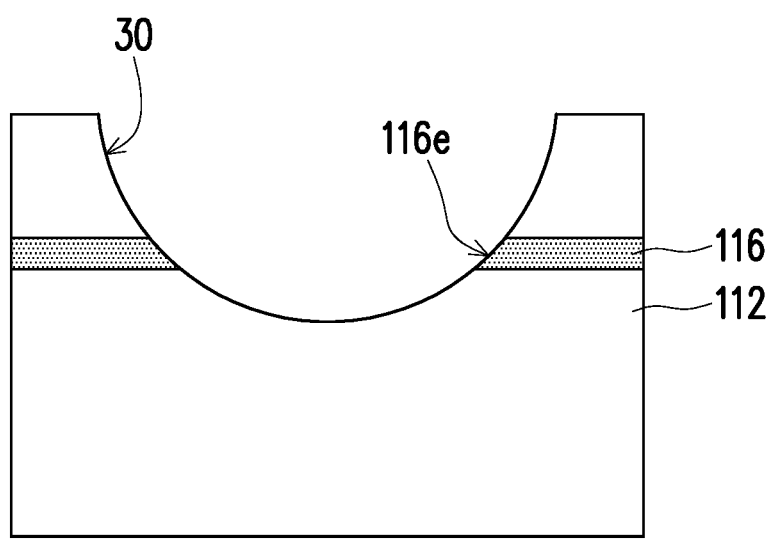
Figure 2E:
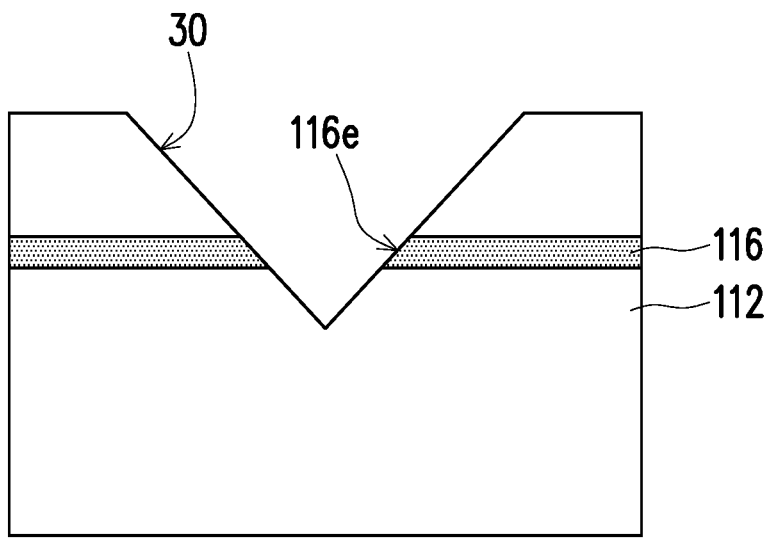
Figure 2F:
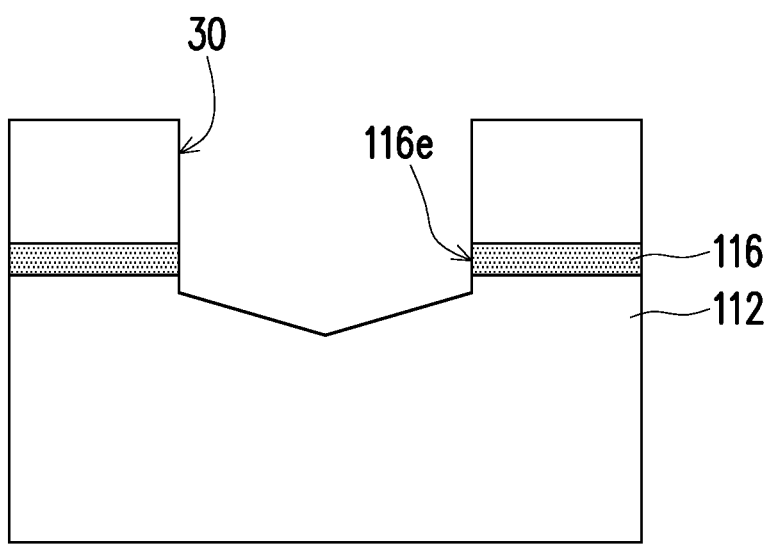

In some embodiments, a cross-sectional shape of the groove 30 may include polygon, U-shape, V-shape, or a combination thereof. For example, as shown in FIG. 1A, the cross-sectional shape of the groove 30 may be rectangular. As shown in FIG. 2A, the cross-sectional shape of the groove 30 may be a trapezoidal. As shown in FIG. 2B to FIG. 2D, the cross-sectional shape of the groove 30 may be U-shaped. As shown in FIG. 2E, the cross-sectional shape of the groove 30 may be V-shaped. As shown in FIG. 2F, the cross-sectional shape of the groove 30 may be a combination of a rectangle and V-shaped. Here, a difference between the U-shapes in FIG. 2B to FIG. 2D is that an angle between a tangent direction and a horizontal direction of an upper U-shaped extension is different. For example, the angle between the tangent direction and the horizontal direction of the U-shaped upper extension of FIG. 2B is 90 degrees. Furthermore, the U-shapes in FIG. 2B to FIG. 2D may have different radii of curvature. For example, the radius of curvature of the U-shape in FIG. 2B may be smaller than the radius of curvature of the U-shape in FIG. 2D, but the disclosure is not limited thereto.

Figure 2G:
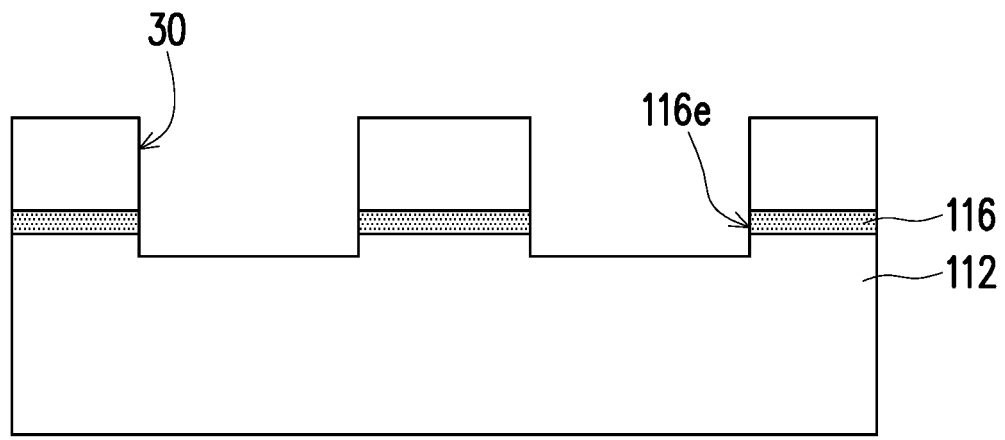
Figure 2H:
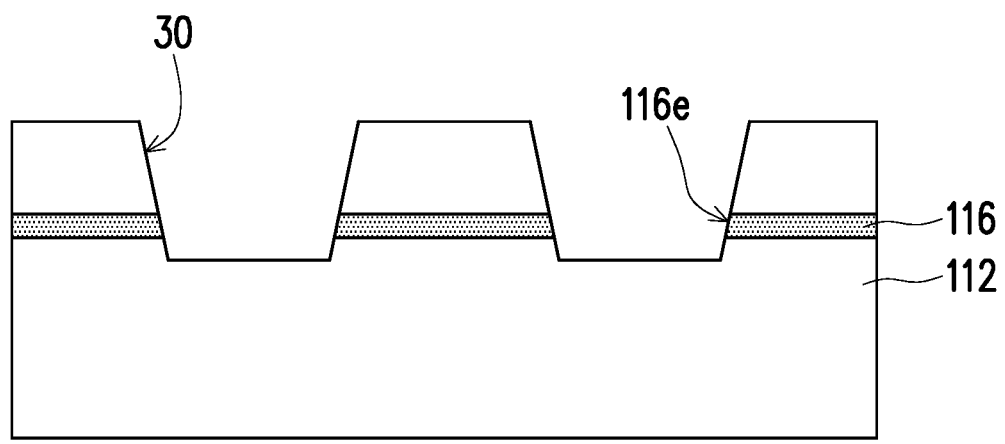
Figure 2I:
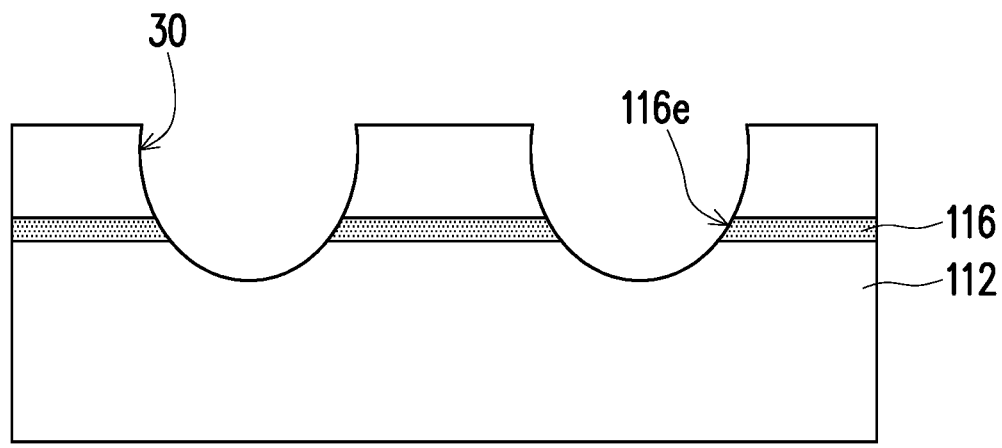
Figure 2J:
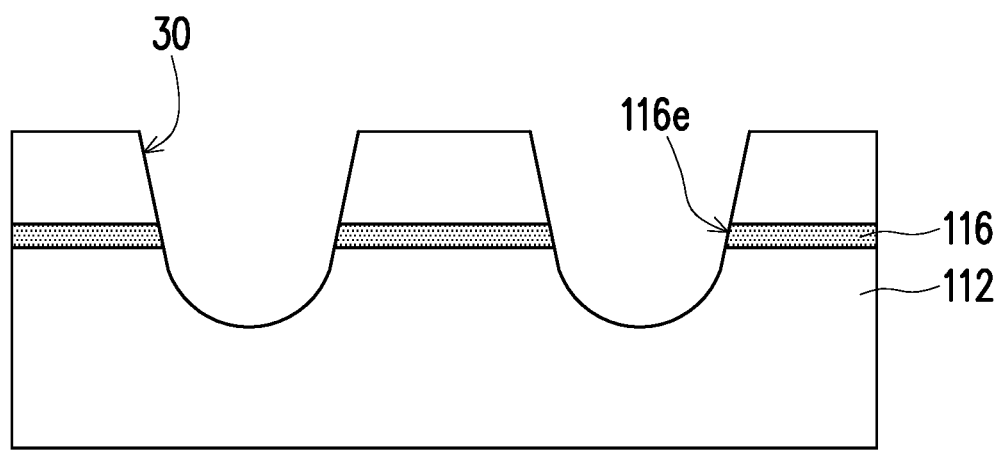
Figure 2K:
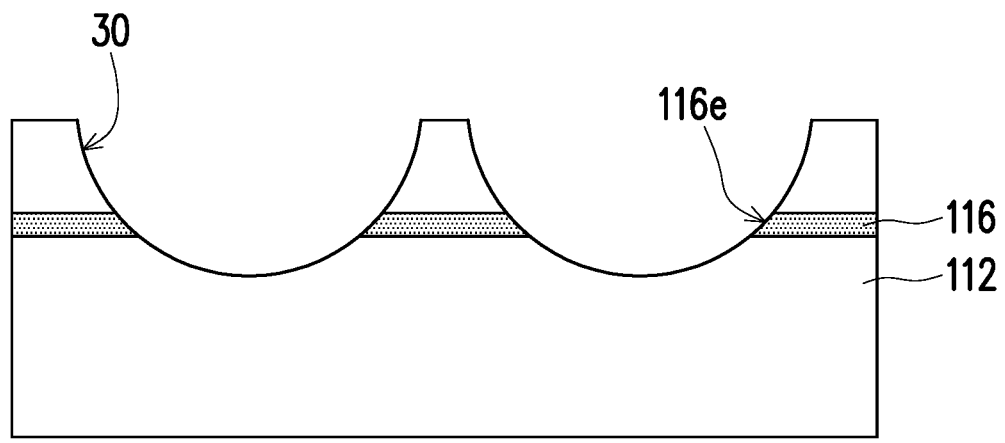
Figure 2L:
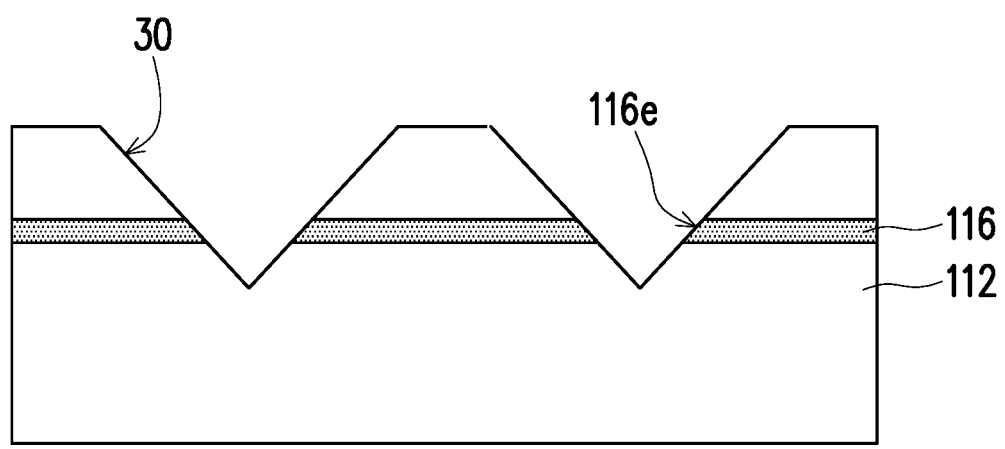
Figure 2M:
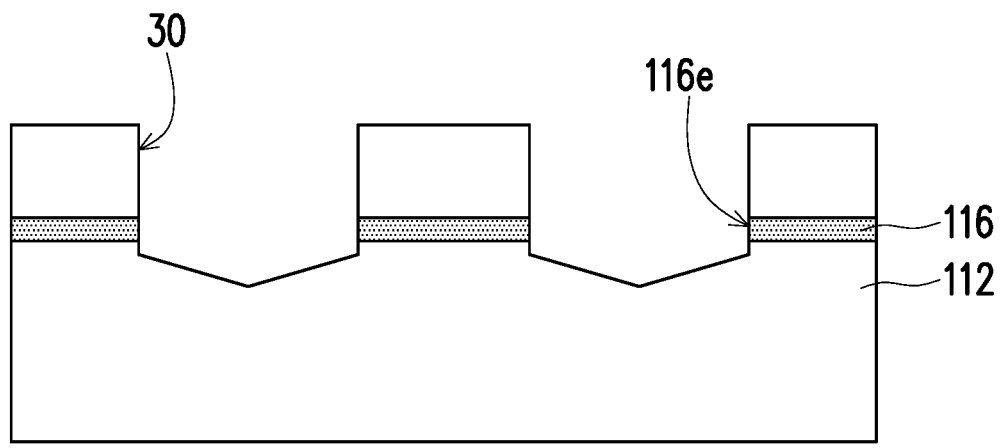

In some embodiments, the cross-sectional shape of the groove 30 may include a concave-convex shape. For example, as shown in FIG. 2G, the cross-sectional shape of the groove 30 may be a concave-convex shape composed of a rectangle. As shown in FIG. 2H, the cross-sectional shape of the groove 30 may be a concave-convex shape composed of a trapezoid. As shown in FIG. 2I to FIG. 2K, the cross-sectional shape of the groove 30 may be a U-shaped concave-convex. As shown in FIG. 2L, the cross-sectional shape of the groove 30 may be a concave-convex composed of a V-shape. As shown in FIG. 2M, the cross-sectional shape of the groove 30 may be a concave-convex shape formed by a combination of a rectangle and a V shape. Here, the difference between the U-shapes in FIG. 2I to FIG. 2K lies in the angle between the tangent direction and the horizontal direction of the upper U-shaped extension. For example, the angle between the tangential direction and the horizontal direction of the upper U-shaped extension of FIG. 2I is 90 degrees. Furthermore, the U-shapes in FIG. 2I to FIG. 2K may have different radii of curvature. The radius of the curvature of FIG. 2I may be smaller than the radius of FIG. 2K, but the disclosure is not limited thereto.

Figure 2N:
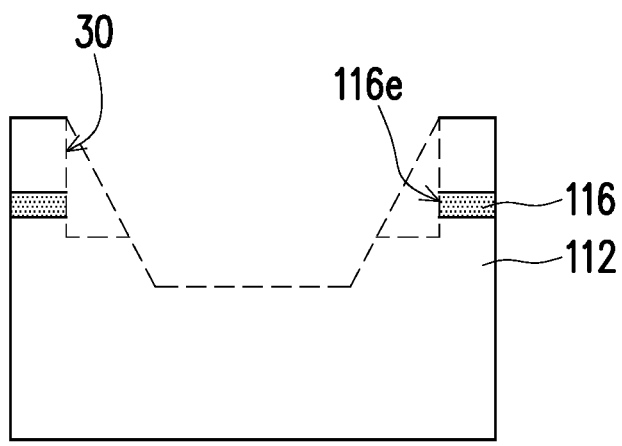
Figure 2O:
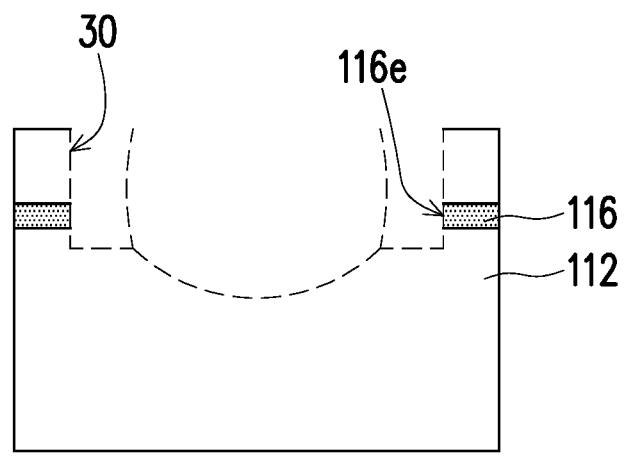
Figure 2P:
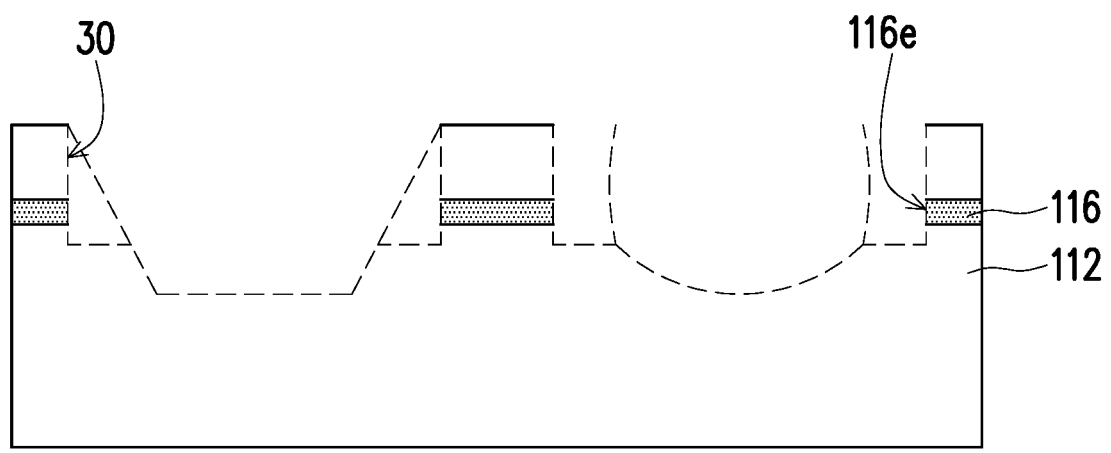

The aforementioned grooves 30 may all be formed in the same step of removing part of the substrate 112. However, the disclosure is not limited thereto. The groove 30 may also be formed by removing part of the substrate 112 and part of the low-k material layer 116 several times. In other words, the groove 30 may include a combination of any two of the polygonal, the U-shape, and the V-shape. For example, as shown in FIG. 2N, the groove 30 may include a combination of a rectangle and a trapezoid. As shown in FIG. 2O, the groove 30 may include a combination of a rectangular and a U-shape. In other words, removing part of the substrate 112 and part of the low-k material layer 116 in the first time may form a rectangle, and removing part of the substrate 112 and part of the low-k material layer 116 in the second time may form a trapezoid/U shape, thereby forming a combination as shown in FIG. 2N/FIG. 2O. Moreover, as shown in FIG. 2P, the cross-sectional shape of the groove 30 may be a concave-convex shape composed of the combinations shown in FIG. 2N/FIG. 2O.

It should be noted that the disclosure does not limit the cross-sectional shape of the groove 30 to the above configuration; as long as the groove 30 exposes the edge 116e of the low-k material layer 116, it belongs to the protection scope of the disclosure.

Please refer to 1B. The dam structure 120 may be formed on the first wafer 110, and part of the dam structure 120 is located in the multiple grooves 30 so as to cover the edge 116e of the low-k material layer 116. In other words, the dam structure 120 may be adjacent to the edge 116e of the low-k material layer 116. In some embodiments, the dam structure 120 may be formed by coating, printing or any other suitable methods using adhesive glue.

Furthermore, in the present embodiment, through the design of the groove 30, part of the dam structure 120 may be located in the groove 30 so as to cover the edge 116e of the low-k material layer 116 to form the edge protection structure of the low-k material layer 116. Therefore, the cracking of the low-k material layer 116 during transportation or manufacturing process may be improved, and the reliability and yield of the sensor 100 may be increased. Furthermore, since the grooves 30 are formed using existing manufacturing processes, the reliability and yield of the sensor 100 are improved without incurring additional manufacturing costs.

In the present embodiment, an orthographic projection of the dam structure 120 on the substrate 112 may overlap an orthographic projection of the sensing area 114 on the substrate 112. In other words, part of the dam structure 120 may be located on the sensing area 114 so as to cover the sensing area 114. However, the disclosure is not limited thereto. In other embodiments, the dam structure 120 may have other configurations.

Figure 1C:
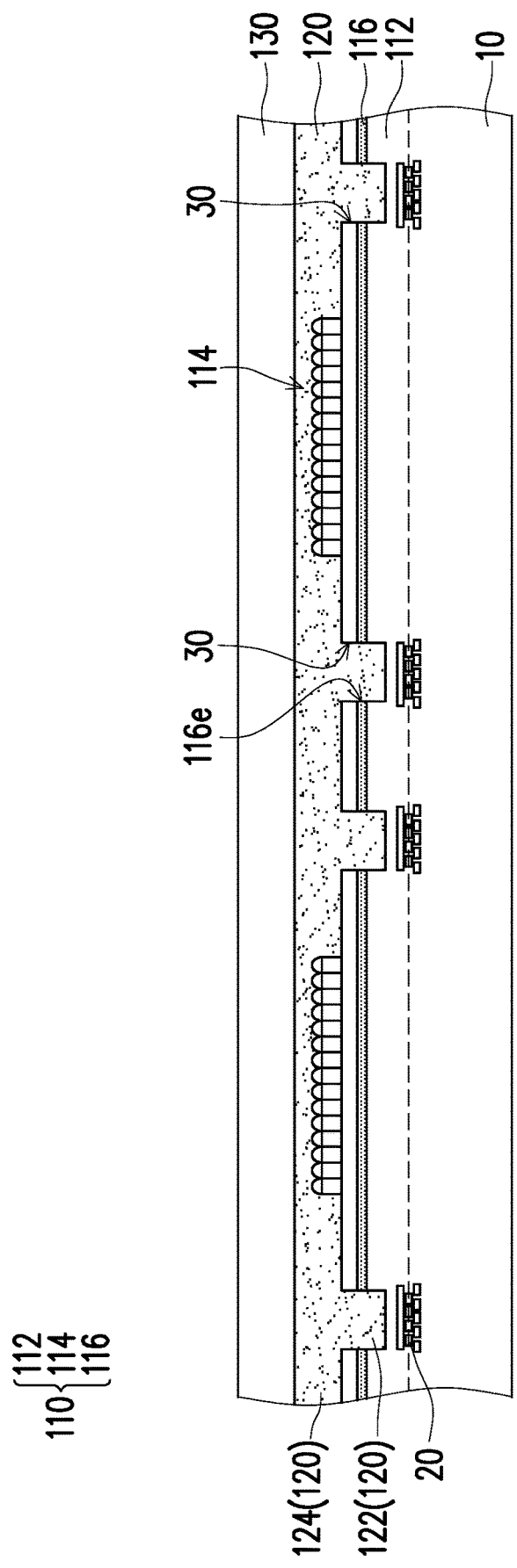
Figure 1D:
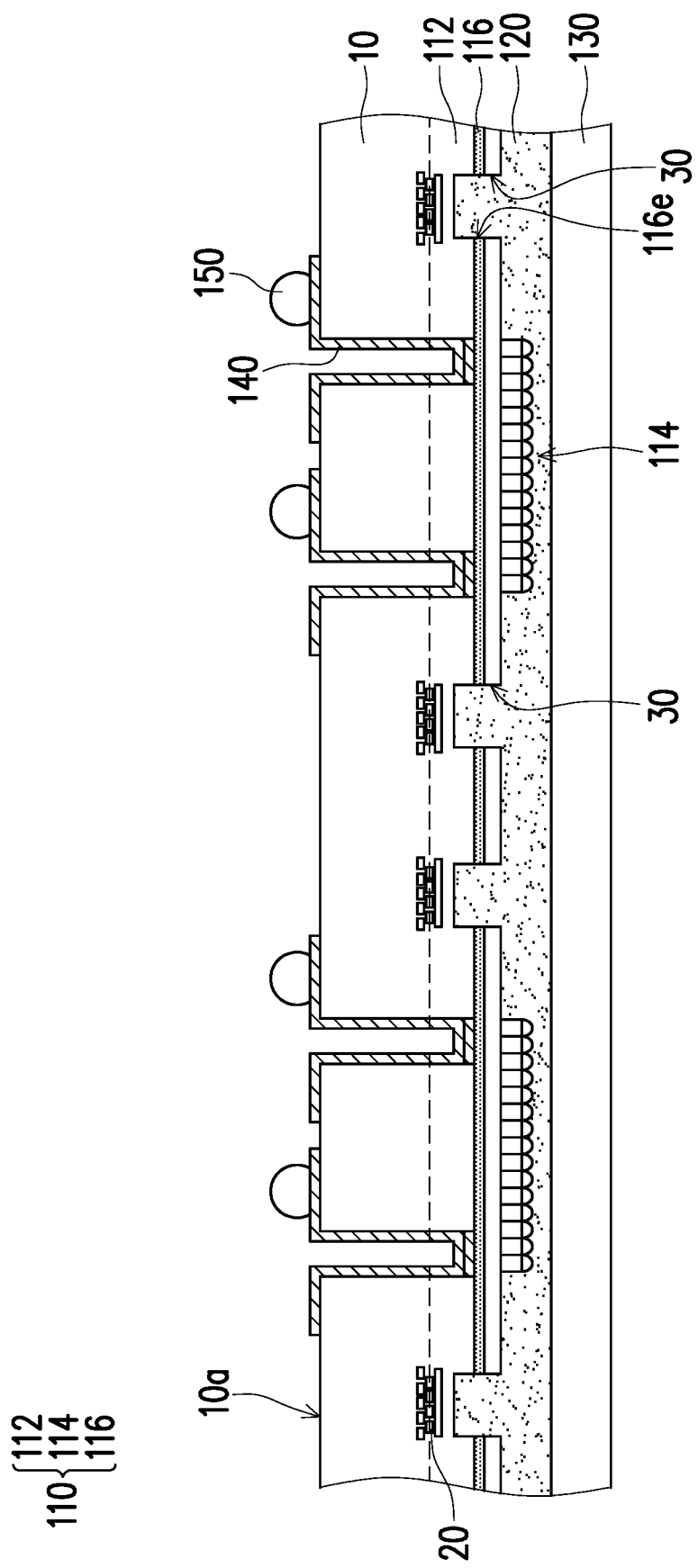

Please refer to FIG. 1C. A cover 130 is disposed on the dam structure 120 such that the cover 130 covers the sensing area 114. In some embodiments, the cover 130 may be a transparent material, so light source from an outside of the sensor 100 may pass through the cover 130 to reach the sensing area 114. For example, the cover 130 may include glass, but the disclosure is not limited thereto. In addition, the cover 130 may be disposed on the dam structure 120 in any suitable manner.

In some embodiments, the dam structure 120 may have a first part 122 away from the cover 130 and a second part 124 close to the cover 130, and the first part 122 may surround the low-k material layer 116. In other words, the second part 124 may be a main body of the dam structure 120, and the first portion 122 may be a protrusion protruding from the second portion 124 toward the low-k material layer 116, but the disclosure is not limited thereto.

Please refer to 1D. When the sensor 100 to be formed subsequently is a back-side illuminated (BSI) image sensor, a through-silicon via (TSV) 140 penetrating through the substrate 112 may be formed after the cover 130 is configured and before the first wafer 110 is cut, and a conductive terminal 150 may be formed on the through-silicon via 140, where the through-silicon via 140 may be electrically connected to the conductive terminal 150. Further, the second wafer 10 may be located between the conductive terminal 150 and the first wafer 110. In other words, the conductive terminal 150 and the second wafer 10 may be located in the direction of the first wafer 110 opposite to the sensing area 114, but the disclosure is not limited thereto.

In some embodiments, the through-silicon via 140 may directly contact the low-k material layer 116, but the disclosure is not limited thereto.

In some embodiments, the through-silicon via 140 may extend from the first wafer 110 through a surface 10a of the second wafer 10, and the second wafer 10 may be located between the conductive terminal 150 and the first wafer 110, but the disclosure is not limited thereto.

In some embodiments, the through-silicon via 140 is formed, for example, by the following steps. First, by etching, drilling or other suitable processes, a through hole penetrating the substrate 112 is formed. Then, a seed material and a conductive material are formed in the through hole so as to form the through-silicon hole 140, but the disclosure does not limit the formation method of the silicon through-silicon via 140.

In some embodiments, the conductive terminal 150 may be a conductive bump such as a solder ball. The conductive terminal 150 may be formed by a ball placement process and/or a reflow process. However, the disclosure is not limited thereto. In some alternative embodiments, the conductive terminal 150 may have other possible forms and shapes based on design requirements.

Figure 1E:
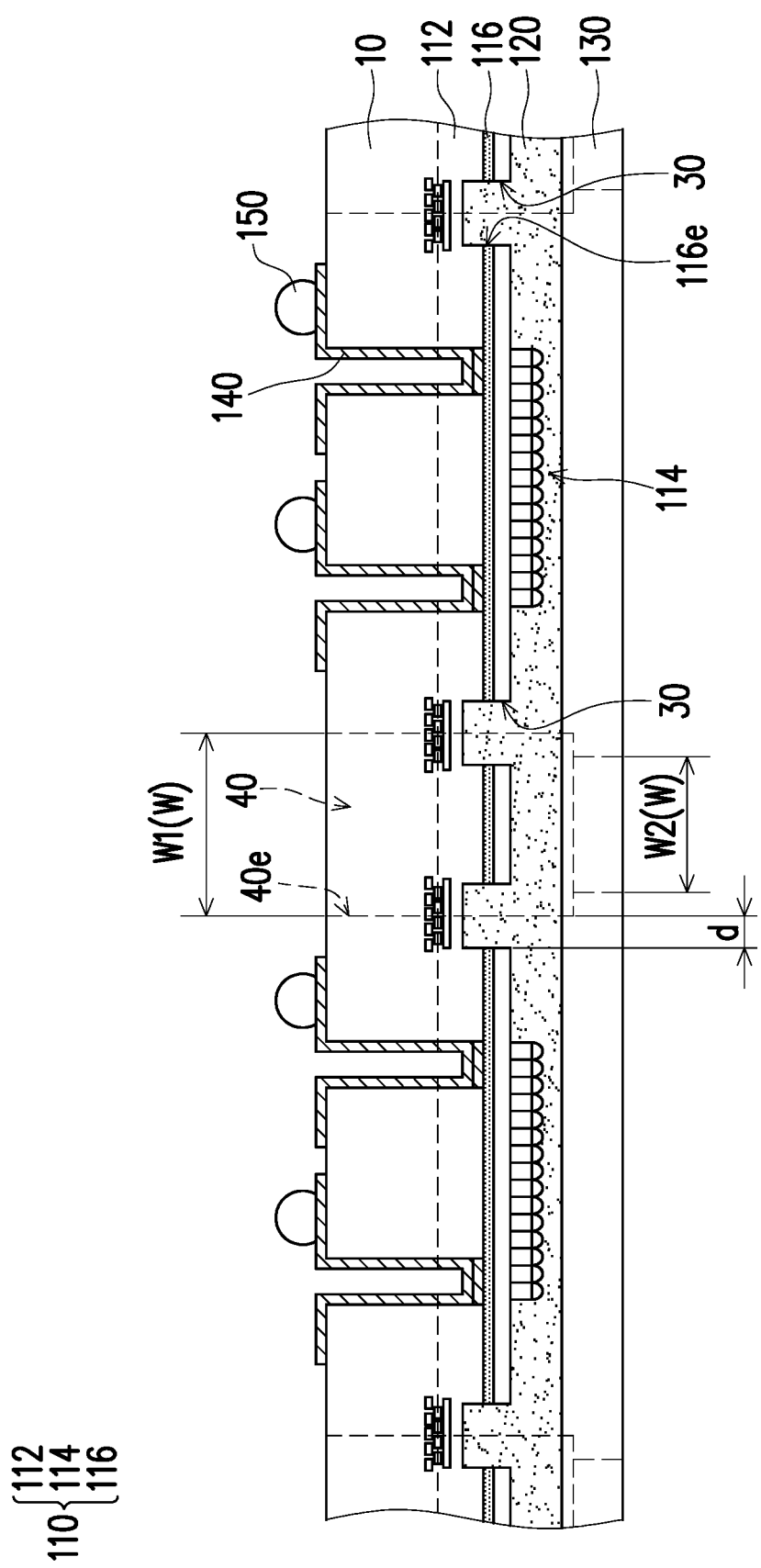
Figure 1F:
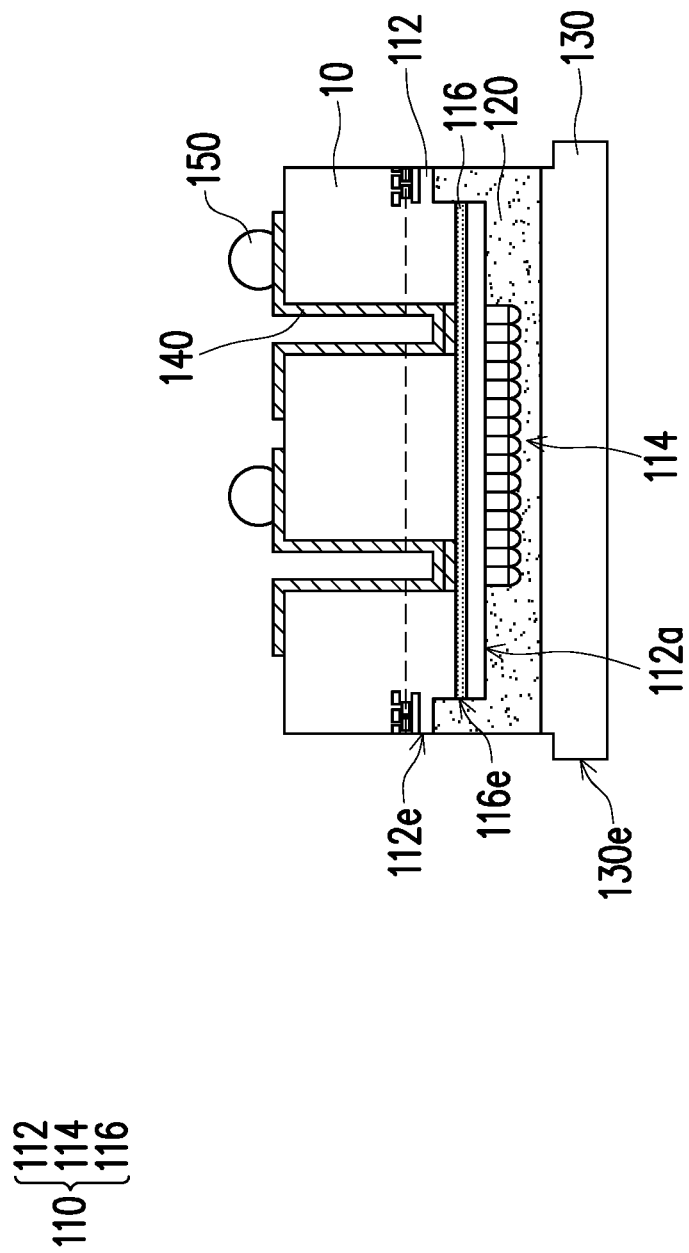

Referring to FIG. 1E and FIG. 1F at the same time, the first wafer 110 is cut so as to form multiple sensors 100. Furthermore, the first wafer 110 may have a cutting path 40. Generally speaking, in order to avoid damaging the fragile low-k material layer due to the excessively fast cutting rate, it is often impossible to increase the output per hour (UPH). However, in the present embodiment, an edge 40e of the cutting path 40 may overlap the dam structure 120; that is, the edge 40e of the cutting path 40 may have a distance d from the edge 116e of the low-k material layer 116, so the dam structure 120 may be regarded as the edge protection structure of the low-k material layer 116, thereby increasing the hourly output.

In some embodiments, in order to further miniaturize the sensor 100, a width W of the cutting path 40 may be less than 150 microns, such that more first chips 110 may be isolated from the first wafer 110, but the disclosure is not limited thereto.

In some embodiments, depending on the material, different sizes of cutters may be selected, so the cutting path 40 may have different widths W. For example, the width W may include a width W1 and a width W2, where a large size cutter may be configured to cut the substrate 112 to form the larger width W1, and a small size cutter may be configured to cut the cover 130 to form the smaller width W2. In addition, as shown in FIG. 1E to FIG. 1F, the large size cutter may cut part of the cover 130 such that the edge of the sensor 100 forms a stepped structure. However, the disclosure is not limited thereto. In embodiments not shown, the cutting path may also have a uniform width.

After the above-mentioned manufacturing process, the manufacturing of the sensor 100 of the present embodiment is substantially completed. The first sensor 110 includes the first chip 110, the wall structure 120 and, the cover 130. The first chip 110 includes the substrate 112, the sensing area 114, and the low-k material layer 116. The sensing area 114 is located on the surface 112a of the substrate 112. The low-k material layer 116 is located in the substrate 112. The dam structure 120 is located on the first chip 110. The dam structure 120 covers the edge 116e of the low-k material layer 116. The cover 130 is located on the dam structure 120 and covers the sensing area 114.

In some embodiments, the edge 112e of the substrate 112 may be sandwiched between the edge 116e of the low-k material layer 116 and an edge 130e of the cover 130. In other words, the edge 116e of the low-k material layer 116 is closest to the sensing area 114, and the edge 130e of the cover 130 is the farthest away from the sensing area 114.

In some embodiments, the edge 116e of the low-k material layer 116 may be retracted from an edge 112e of the substrate 112, such that the substrate 112 has a retracted area, and part of the dam structure 120 may be located in the retracted area, but the disclosure is not limited thereto.

In some embodiments, the first chip 110 may be electrically connected to the conductive terminal 150 through the through-silicon via 140, but the disclosure is not limited thereto.

It should be noted that since the first chip is a chip isolated from the first wafer, the first chip and the first wafer are represented by the same reference numeral. Moreover, a second chip may be isolated from the second wafer.

FIG. 3A to FIG. 3D are schematic partial cross-sectional diagrams of a part of a manufacturing method of a sensor according to another embodiment of the disclosure. In the present embodiment, a sensor 100a is similar to the sensor 100 of the previous embodiment, and similar components thereof are denoted by the same reference numerals, and have similar functions, materials or formation methods, therefore the description is omitted. Specifically, FIG. 3A to FIG. 3D illustrate partial cross-sectional schematic diagrams of a method manufacturing a sensor following the steps of FIG. 3A to FIG. 3D.

Figure 3A:
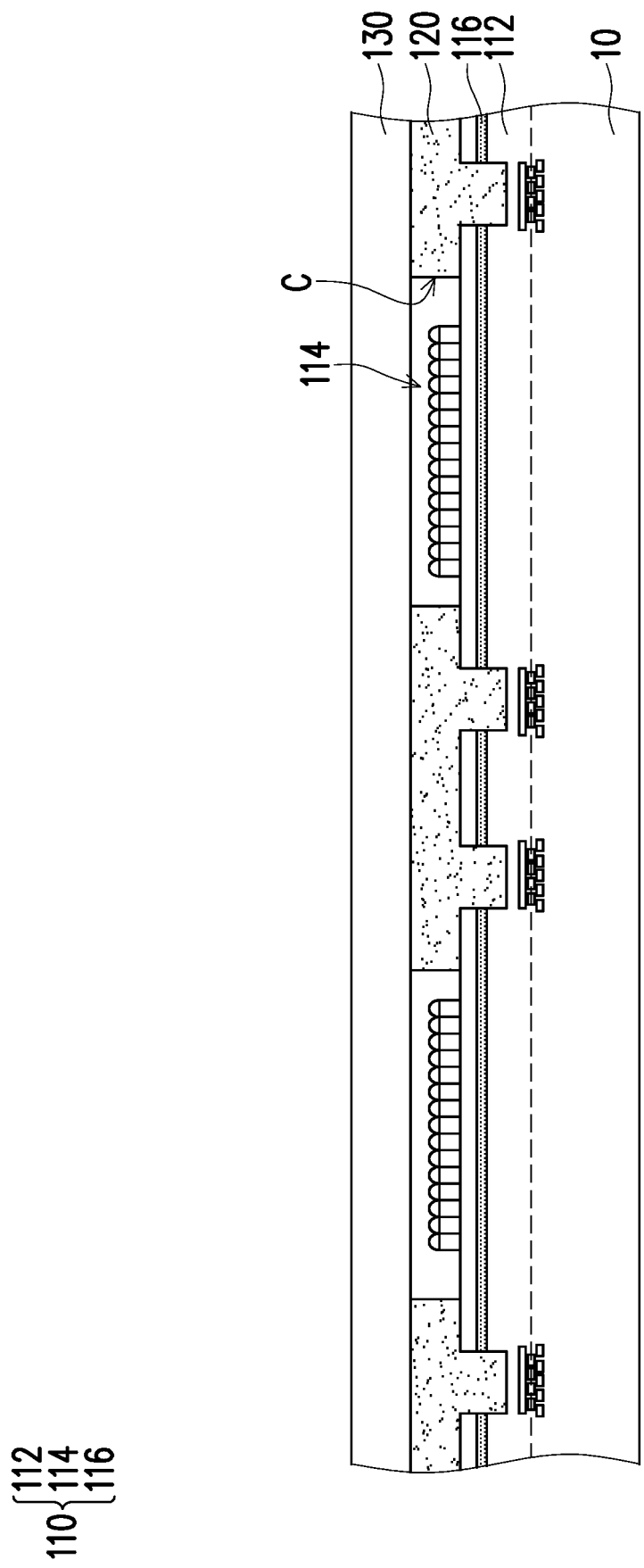
FIG. 3A to FIG. 3D are schematic partial cross-sectional diagrams of a part of a manufacturing method of a sensor according to another embodiment of the disclosure.

Please refer to FIG. 3A. Following FIG. 1B, part of the dam structure 120 may be further removed, such that the dam structure 120 exposes the sensing area 114. In other words, a cavity C may be formed between the dam structure 120, the cover 130, and the substrate 112, and the sensing area 114 may be located in the cavity C. In some embodiments, part of the dam structure 120 may be removed by a photolithography process, but the disclosure is not limited thereto.

Figure 3B:
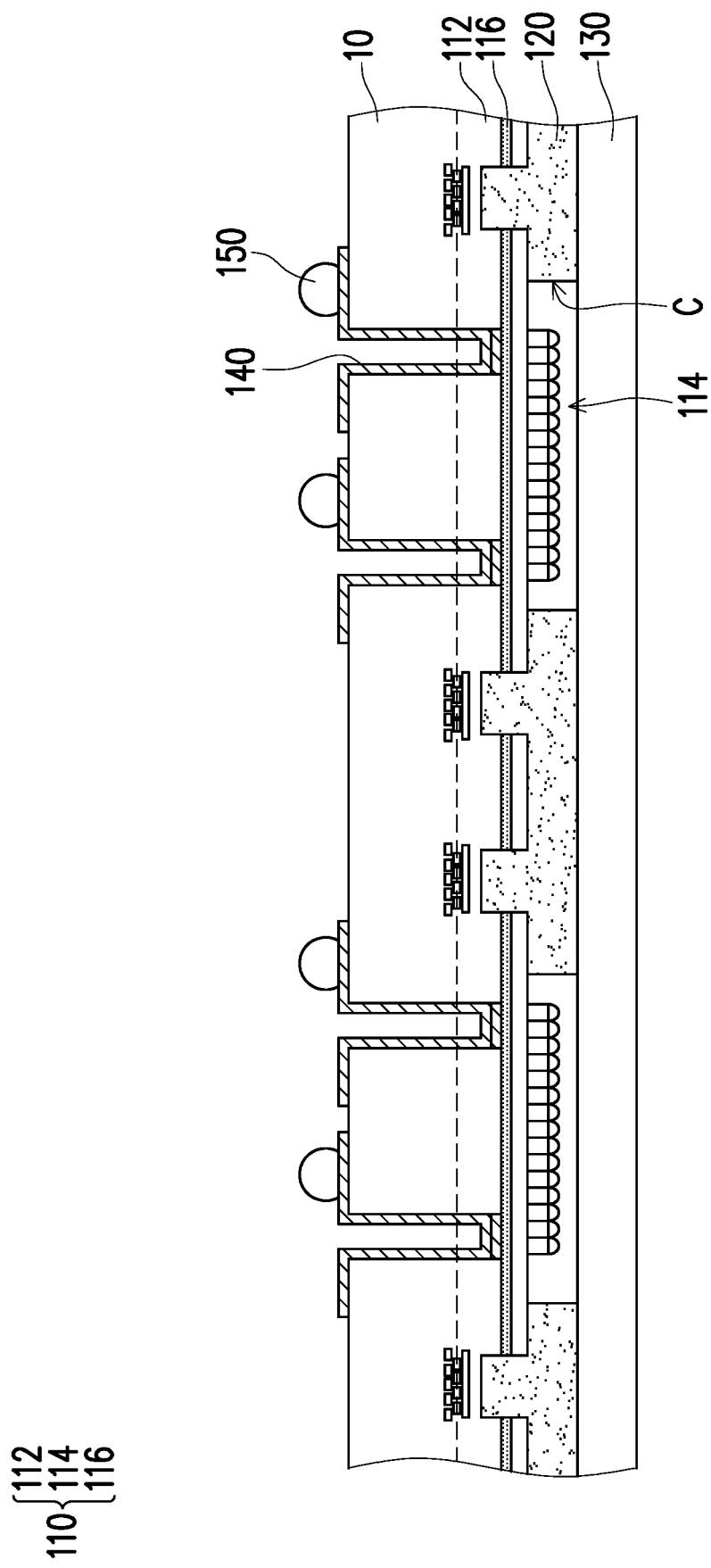
Figure 3C:
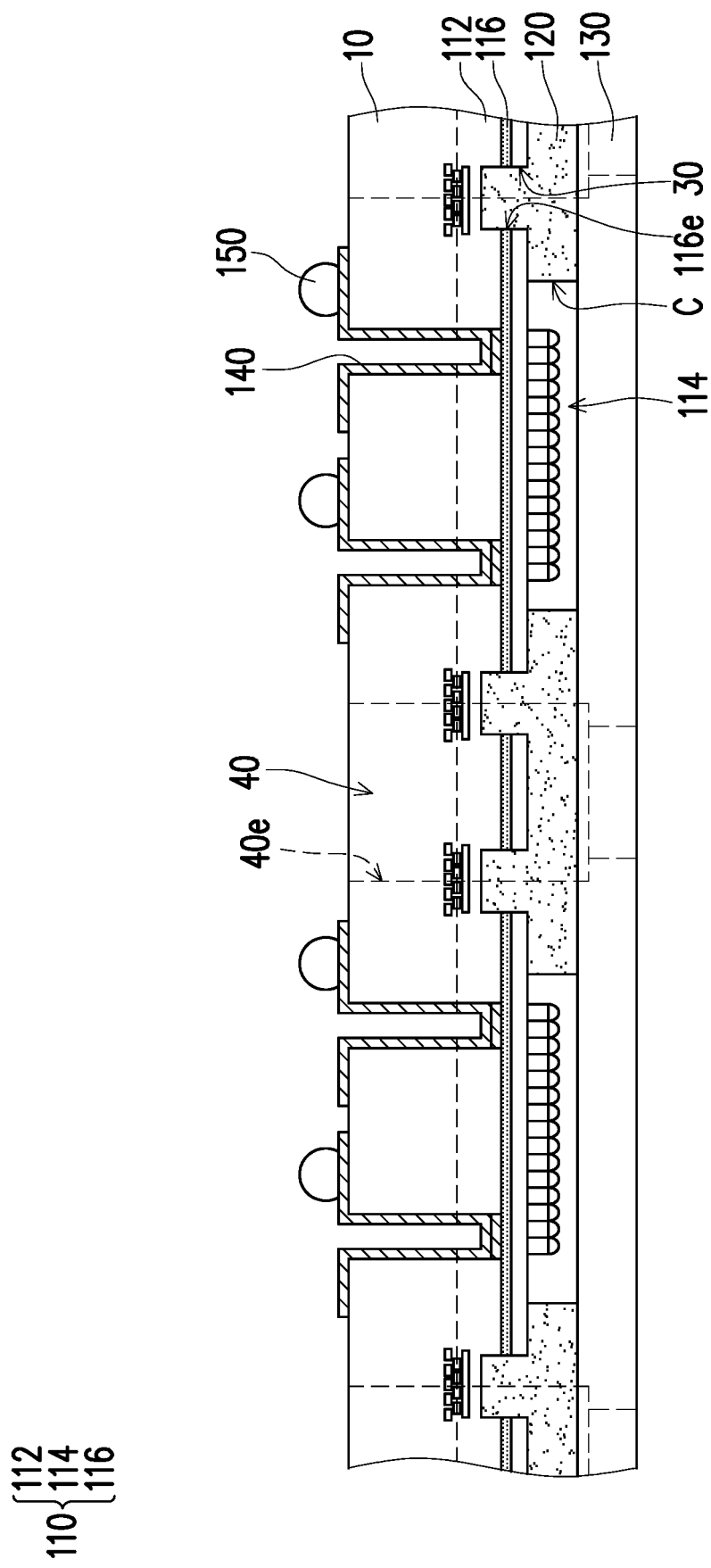
Figure 3D:
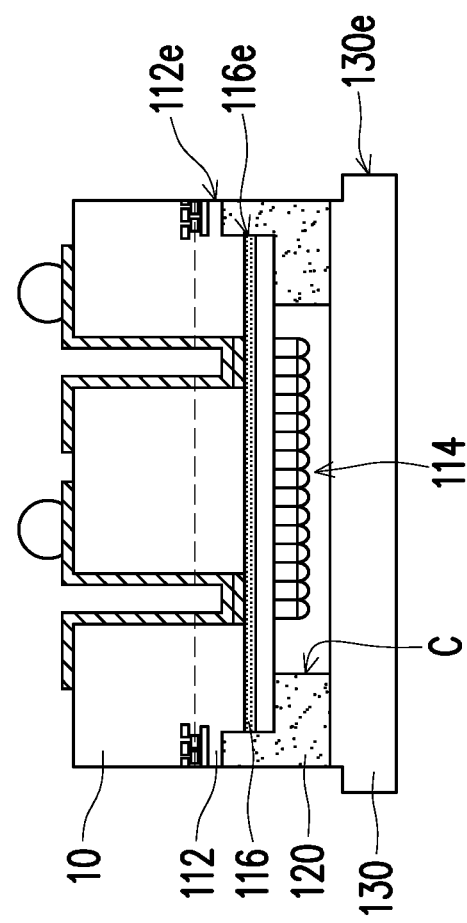

Please refer to FIG. 3A to FIG. 3D at the same time. Similar to FIG. 1C to FIG. 1F, after the dam structure 120 having the cavity C is formed, the cover 130 may be disposed on the dam structure 120 (as shown in FIG. 3A). Next, the through-silicon via 140 and the conductive terminal 150 are formed (as shown in FIG. 3B), and then the first wafer 110 is cut so as to form multiple sensors 100a (as shown in FIG. 3C to FIG. 3D).

In summary, in the disclosure, through the design of the groove, part of the dam structure may be located in the groove so as to cover the edge of the low-k material layer to form the edge protection structure of the low-k material layer. Therefore, the cracking of the low-k material layer during transportation or manufacturing can be improved, and the reliability and yield of the sensor can be increased. Furthermore, since the grooves are formed using existing manufacturing processes, the reliability and yield of the sensor are improved without incurring additional manufacturing costs.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A sensor, comprising:
   a first chip, comprising a substrate, a sensing area, and a low-k material layer, wherein the sensing area is located on a surface of the substrate, and the low-k material layer is located in the substrate;
   a dam structure, located on the first chip, wherein the dam structure covers an edge of the low-k material layer perpendicular to the surface of the substrate, and the edge of the low-k material layer is retracted from an edge of the substrate, such that the substrate has a retracted area, and a part of the dam structure is located in the retracted area; and
   a cover, located on the dam structure and covering the sensing area.

2. The sensor according to claim 1, wherein the dam structure comprises a first part and a second part, the second part is located between the first part and the cover, and the first part surrounds the low-k material layer.

3. The sensor according to claim 1, wherein an orthographic projection of the dam structure on the substrate overlaps an orthographic projection of the sensing area on the substrate.

4. The sensor according to claim 1, wherein a cavity is surrounded by the dam structure, the cover, and the substrate, and the sensing area is located in the cavity.

5. The sensor according to claim 1, further comprising a second chip, bonded to a side of the first chip opposite to the sensing area.

6. The sensor according to claim 5, wherein the second chip is a logic chip.

7. The sensor according to claim 1, further comprising:
   a through-silicon via, penetrating the substrate; and
   a conductive terminal, located in a direction of the first chip opposite to the sensing area, wherein the first chip is electrically connected to the conductive terminal through the through-silicon via.

8. The sensor according to claim 7, wherein the through-silicon via is in direct contact with the low-k material layer.

* * * * *